United States Patent
Ranjan et al.

(10) Patent No.: US 9,318,343 B2
(45) Date of Patent: Apr. 19, 2016

(54) METHOD TO IMPROVE ETCH SELECTIVITY DURING SILICON NITRIDE SPACER ETCH

(71) Applicant: Tokyo Electron Limited, Minato-ku, Tokyo (JP)

(72) Inventors: Alok Ranjan, Mechanicville, NY (US); Blake Parkinson, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/301,698

(22) Filed: Jun. 11, 2014

(65) Prior Publication Data

US 2015/0364338 A1    Dec. 17, 2015

(51) Int. Cl.
| | |
|---|---|
| *H01L 21/461* | (2006.01) |
| *H01L 21/311* | (2006.01) |
| *H01L 29/66* | (2006.01) |
| *H01L 29/51* | (2006.01) |
| *H01L 21/02* | (2006.01) |
| *H01L 21/318* | (2006.01) |

(52) U.S. Cl.
CPC .... *H01L 21/31116* (2013.01); *H01L 21/02337* (2013.01); *H01L 21/3185* (2013.01); *H01L 29/518* (2013.01); *H01L 29/6656* (2013.01); *H01L 29/66795* (2013.01)

(58) Field of Classification Search
CPC ................... H01L 21/31116; H01L 21/02337; H01L 21/3185; H01L 29/6656; H01L 29/518; H01L 29/66795
USPC ................... 438/706, 595, 738, 716, 303, 744
See application file for complete search history.

(56) References Cited

U.S. PATENT DOCUMENTS

| | | | | |
|---|---|---|---|---|
| 5,611,888 | A * | 3/1997 | Bosch et al. ................... | 438/724 |
| 5,786,276 | A * | 7/1998 | Brooks et al. .................. | 438/724 |
| 6,784,108 | B1 | 8/2004 | Donohoe et al. | |
| 6,962,879 | B2 | 11/2005 | Zhu et al. | |
| 2013/0292805 | A1* | 11/2013 | Cai et al. ........................ | 257/622 |
| 2014/0011332 | A1* | 1/2014 | Meng ............................ | 438/197 |

* cited by examiner

*Primary Examiner* — Michael Trinh
(74) *Attorney, Agent, or Firm* — Wood, Herron & Evans, LLP

(57) ABSTRACT

Techniques herein include methods to increase etching selectivity among materials. Techniques herein include a cyclical process of etching and oxidation of a silicon nitride (SiN) spacer and silicon (such as polycrystalline silicon). This technique can increase selectivity to the silicon so that silicon is less likely to be etched or damaged while silicon nitride is etched from sidewalls. Techniques and chemistries as disclosed herein can be more selective to silicon oxide and silicon as compared to silicon nitride. An oxidizing step creates an oxide protection film on silicon surfaces that is comparatively thicker to any oxide film formed on nitride surfaces. As such, techniques here enable better removal of silicon nitride and silicon nitride spacer materials.

21 Claims, 5 Drawing Sheets

METHOD TO IMPROVE ETCH SELECTIVITY DURING SILICON NITRIDE SPACER ETCH

CROSS REFERENCE TO RELATED APPLICATIONS

None.

BACKGROUND OF THE INVENTION

This disclosure relates to fabrication of features in a semiconductor device, including fabrication via etching and deposition processes.

Fabrication of semiconductor devices is a multi-step process of forming features on a semiconductor substrate or other substrate. Steps can include material growth, patterning, doping, deposition, etching, metallization, planarization, and so forth. Features formed on a substrate can include various transistors. Transistors can be planar or non-planar, and can also have single gates or multiple gates. Non-planar transistors (sometimes referred to as 3D transistors) include the FinFET (fin field effect transistor), among others. Such non-planar transistors typically include a vertically-oriented or raised fin that functions as a channel between the source and drain. The gate is also vertically-oriented or raised and is positioned over the fin (on top of the fin and around fin sidewalls). Such non-planar transistors can have multiple fins and/or multiple gates. Planar transistors also have associated heights, though relative heights of non-planar features are usually greater than those of planar transistors.

Fabrication of semiconductor devices often includes deposition of spacer and/or dummy materials to assist in constructing a given feature design, including features on non-planar transistors. Sidewall spacers are often specified on non-planar transistors for improved gate functionality. As the dimensions of the transistor gate continue to shrink, the fringe capacitance between the gate and contact, as well as between the gate and facet of the source/drain (S/D), has increased. To counter this increase in fringe capacitance, low-k dielectric materials have been implemented as the spacer material. The success of a spacer is affected by a spacer etch process, which can affect both the dielectric constant of the spacer, as well as spacer coverage.

SUMMARY

During fabrication of a transistor gate, a spacer material is conformally applied to the transistor gate and other structures (such as by atomic layer deposition), and then partially removed to form a sidewall spacer on a sidewall of the transistor gate. This partial removal step specifies removing spacer material from the other structures, while leaving spacer material on the gate or on gate sidewalls. Such partial removal is typically executed using one or more etching processes, but can be challenging because of the differing heights of features being etched simultaneously as well as thicknesses of spacer material.

Having features of different heights means that some spacer material in some locations will be etched through to underlying material faster than spacer material at other locations. Moreover, because of the typically anisotropic direction of etchants striking a given substrate, spacer material is etched (cleared) from horizontal surfaces more quickly while spacer material on vertical surfaces requires substantially longer etch processing time. With underlying horizontal surfaces exposed for a relatively long period, while vertically-oriented spacer material is removed, a given etch process should be highly selective so as not to damage or etch underlying material. In one common example, spacer material needs to be selectively removed from around fins without damaging or etching the fins themselves. Removing the conformal film from around the fins can be in preparation for growing silicon carbide and silicon germanium in those areas. If not all of the conformal film is removed from around fins then desired electrical performance cannot be achieved.

In a non-planar fabrication scheme, selectivity requirements are very challenging because over-etch amounts or durations needed to clear spacer material from fin-sidewalls are very long compared to etching of planar schemes. This over etch amount can be a 150% to 200% over etch time as compared to approximately 20-30% over etch times with planar transistors. The conformal film needs to be removed without etching the fin (or substantially etching the film). With such long over etch times typically needed, however, it is difficult to avoid damaging or etching the fin.

Techniques herein include methods to increase etch selectivity among materials. Techniques herein include a cyclical process of etching and oxidation of a silicon nitride (SiN) spacer and silicon (such as polycrystalline silicon). This technique can increase selectivity to the silicon so that silicon is less likely to be etched or damaged while silicon nitride is being etched from sidewalls. Techniques and chemistries as disclosed herein can be more selective to silicon oxide and silicon as compared to silicon nitride. An oxidizing step creates an oxide protection film on silicon surfaces that is comparatively thicker to any oxide film formed on nitride surfaces. As such, techniques herein enable better removal of silicon nitride and silicon nitride spacer materials.

One embodiment includes a method of etching features on a substrate. This method includes positioning a substrate on a substrate holder in a plasma processing chamber. The substrate has a silicon nitride film covering structures on the substrate. A first process gas mixture is flowed into the plasma processing system. The first process gas mixture includes a halogen-containing gas. A second process gas mixture is flowed into the plasma processing system. The second process gas mixture includes an oxygen-containing gas. Plasma is created and maintained using the first process gas mixture and the second process gas mixture. A flow rate of the first process gas mixture and/or a flow rate of the second process gas mixture is varied such that a gas flow ratio of the halogen-containing gas to the oxygen-containing gas fluctuates between a first gas ratio and a second gas ratio. Products of the plasma are anisotropically directed toward the substrate. Accordingly, selectivity between SiN (silicon nitride) and silicon is improved.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include methods to increase etching selectivity among materials. Techniques herein include a cyclical process of etching and oxidation of a silicon nitride (SiN) spacer and silicon (such as polycrystalline silicon). This technique can increase selectivity to the silicon so that silicon is less likely to be etched or damaged while silicon nitride is etched from sidewalls and other surfaces. Techniques and chemistries as disclosed herein can be more selective to silicon oxide and silicon as compared to silicon nitride. An oxidizing step creates an oxide protection film on silicon surfaces that is comparatively thicker to any oxide film formed on nitride surfaces. As such, techniques here enable better removal of silicon nitride and silicon nitride spacer materials.

Improved removal of silicon nitride is enabled in part based on discoveries herein that silicon material (crystalline silicon) oxidizes at a faster and/or thicker rate as compared to oxidation of silicon nitride. Thus, methods herein include a process of etching a portion of spacer material followed by a relatively short oxidation step, and then returning to etching a subsequent portion of spacer material. This etching-oxidation cycle can be repeated until meeting a design specification such as removing conformal spacer material from around a given structure. In other words, periods of etch activity followed by periods of protection are cycled. The result of such methods and discoveries herein can include better etch selectivity, as well as uncovering fin structures with more fin material remaining as compared to conventional processes.

Figure 1:
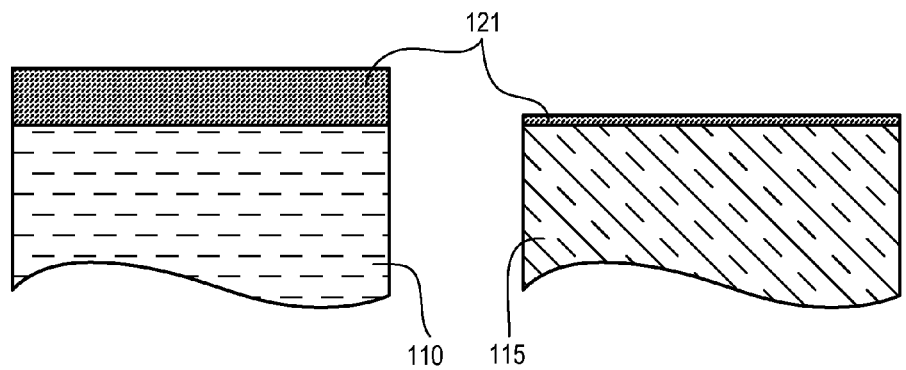
FIG. 1 is a cross-sectional schematic view of protection layer growth on various substrates.

FIG. 1 is a cross-sectional schematic example of materials receiving a protection layer. For example, material 110 can include polycrystalline silicon, which is often referred to as polysilicon or silicon. Material 115 can include silicon nitride, which is often used as a spacer material with various microfabrication techniques. Under similar or identical conditions in a given plasma processing system, a protection layer 121 forms on both materials. Note, however, that protection layer 121 forms on the silicon material at a faster rate or greater thickness as compared to formation on the silicon nitride material. The protection layer can be an oxide layer which is typically fluorinated silicon oxide (SiOF). This differing thickness of protection layer 121 means that during a given etch period or step, the protection layer covering the nitride material will quickly be removed while the protection layer covering the silicon material will be removed (etched away) at a slower rate thereby protecting the silicon material for a longer duration.

Improved etch selectivity between silicon nitride and silicon can be achieved using gas pulsing of either a halogen-containing chemistry or an oxygen-containing chemistry so the relative amounts of oxygen in a corresponding plasma can fluctuate between a relatively lesser amount of oxygen and the relatively greater amount of oxygen. One example chemistry for use in creating and feeding a plasma can include CH3F, oxygen, and one or more carrier gases. Etch techniques can include switching between an etching period or phase of a substrate treatment process and an oxidation period or phase of the substrate treatment process. During the phase labeled as oxidation, a SiOF layer or film forms more readily on exposed silicon material as compared to any formation on exposed nitride material surfaces. Accordingly, a thicker SiOF oxy-fluorocarbon layer/film is formed on silicon surfaces as compared to nitride surfaces. After a typically shorter oxidation phase (as compared to etch phase), an etch step can be continued that etches through the fluorine-containing oxide film covering the nitride and then continues etching more of the nitride material itself. Such a fluorine-containing oxide film can then better protect silicon surfaces during etch phases of a cyclical etch process as disclosed herein. For example, the fluorine-containing oxide film can remain thick enough to protect silicon during at least a portion of a given etch phase. In some embodiments, the oxide film can be thick enough for at least a portion of the oxide film to remain on silicon surfaces throughout the duration of a given etch phase. In other embodiments, the oxide film protects silicon surfaces for a portion of the etch phase and then the silicon material is exposed to a remaining duration of the etch phase. A given etch chemistry is typically selected to inherently provide etch selectivity between silicon nitride and silicon as well silicon nitride and silicon oxide, but this etch selectivity is typically not perfect. By having an oxide film protection available—for at least a portion of a given etch phase—overall etch selectivity can be improved.

Figure 2:
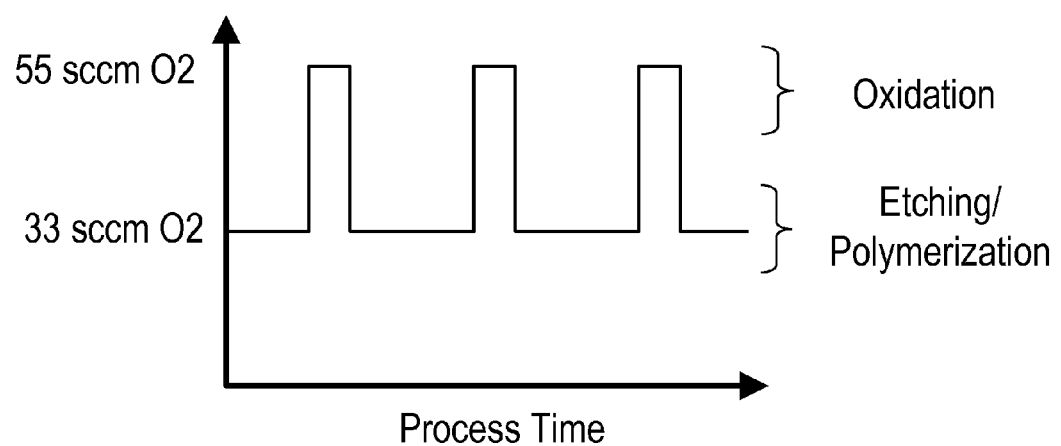
FIG. 2 is a graph illustrating an etching technique according to embodiments disclosed herein.

Design specifications of a given microfabrication process and/or capabilities of a given plasma processing system can influence actual flow rates, flow times, and other etch parameters. By way of a non-limiting example, a given etch process can be executed in a plasma processing system at 40 mT of pressure, 1200 MW of power, and 70 W of bias power, and with the processing system maintained at about 80 degrees Celsius. Referring now to FIG. 2, example chemistry can include 110 standard cubic centimeters (sccm) of argon, 55 sccm of CH3F, and O2 fluctuating between 33 sccm and 55 sccm. Thus, methods can include fluctuating an amount of oxygen being fed into plasma processing space above a given substrate. Note that these flow rates are merely exemplary and can change based on size of a plasma processing system and/or size of a given substrate being processes. Affecting the relative amount of oxygen can be accomplished by increasing and decreasing a flow rate of oxygen. Alternatively, relative amounts of oxygen (a ratio of oxygen) can be affected by increasing and decreasing other etch chemistries within a corresponding plasma processing system.

Figure 4:
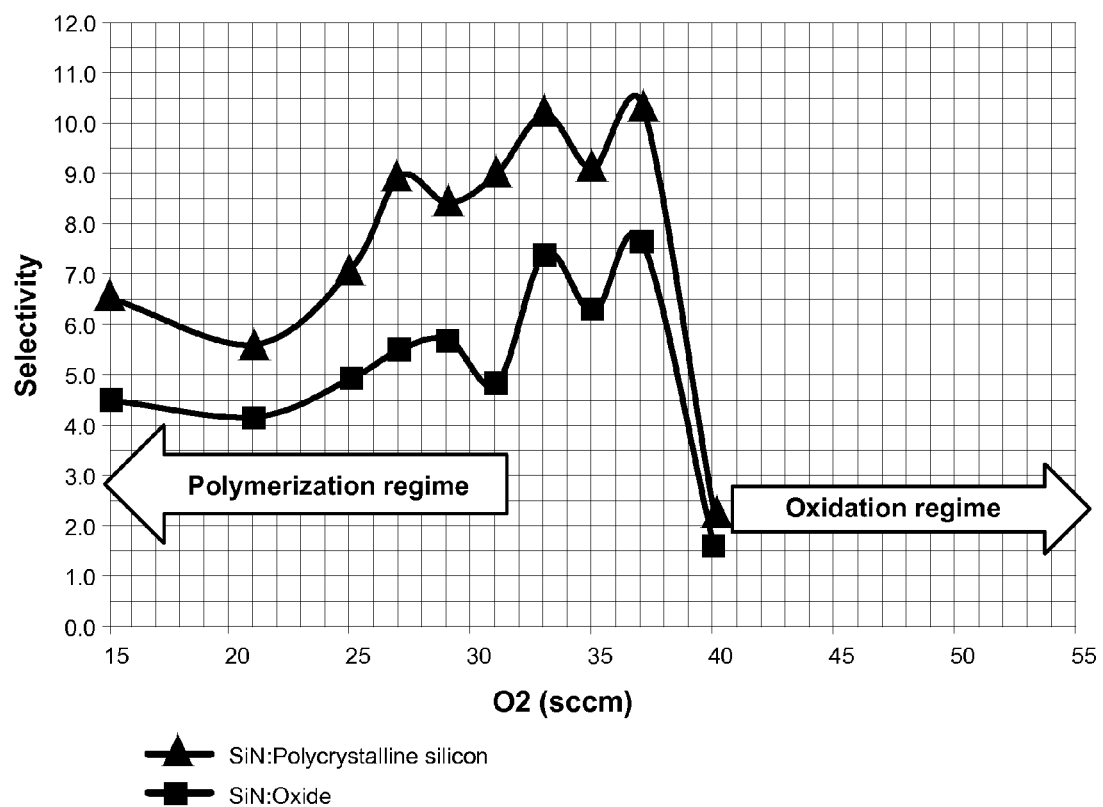
FIG. 4 is a graph illustrating etch selectivities of various materials based on relative oxygen amounts.

FIG. 4 is a graph that illustrates an etch selectivity ratio of silicon nitride to polycrystalline silicon, and also an etch ratio of silicon nitride to silicon oxide with an example CH3F flow rate of 55 sccm. Note that around a central portion of the graph, with O2 flow around 33 sccm, conventional etch selectivity is at its highest point. As a proportion of oxygen increases (and is maintained at a higher flow rate) etch selectivity dramatically drops and etch progress is arrested, as can be seen in the oxidation regime section. On the other side of the graph, if an oxygen flow rate falls below 30 sccm for this particular CH3F flow rate, then more carbon-based polymer deposition occurs which degrades etch selectivity and also slows etching progress. With oxygen flow in the mid-30s sccm an etch selectivity of 10.2:1 can be achieved in that silicon nitride is being etched at a rate 10 times faster than a rate of etching silicon. With techniques herein, by cyclically increasing oxygen flow and then returning oxygen flow to a baseline flow rate, etch selectivities can be improved to 12.2. Likewise, nitride to oxide selectivity can improve from a ratio of about 7.4:1 to about 9.7:1. By way of a non-limiting example 33 sccm of O2 can be flowed for approximately 5 seconds, followed by increasing O2 flow to 55 sccm for approximately one second, and then returning O2 flow to 33 sccm. In other embodiments, increased oxygen flow can be one second for every three seconds of etch time, one second for every 10 seconds etch time, and so forth. The increased O2 flow rate can be based on a particular wafer being treated. For this particular example, O2 flow can be selected to have a value between 45 and 65 sccm or otherwise. Accordingly, flow rates can use various step points, and cycle times and pulse durations can be variable. Note that flow rates can be based on a given size of a plasma processing system. In some embodiments, flow ratios can be independent of size. Thus, example flow ratios can include a halogen-containing gas to oxygen gas ratio of about 1.5:1 for an etch phase, followed by a gas ratio of about 1:1 for an oxidation phase. Pulsing schemes can be embodied as a gradient change or abrupt change (sinusoidal wave or square wave). This significant etch selectivity improvement means, for example, better etch selectivity during over etch processes.

In a given microfabrication technique, such as for non-planar transistor structures, surfaces of other materials may be exposed. For example, it is common to have silicon oxide (buried oxide) underlying fin structures. This means that a given chemistry used to etch silicon nitride needs to be selective to both silicon and silicon oxide. As shown in FIG. 4, there is existing etch selectivity between silicon nitride and silicon oxide. Thus, the etch selectivity improvement described herein is not limited to silicon but also benefits silicon oxide materials. Maintaining integrity of oxide materials underlying fin structures can be beneficial for subsequent processes such as growing silicon carbide or silicon germanium around fins. In some embodiments, the fluorine-containing oxide film formed on silicon oxide may not be as thick as compared to that formed on silicon material.

Figure 3:
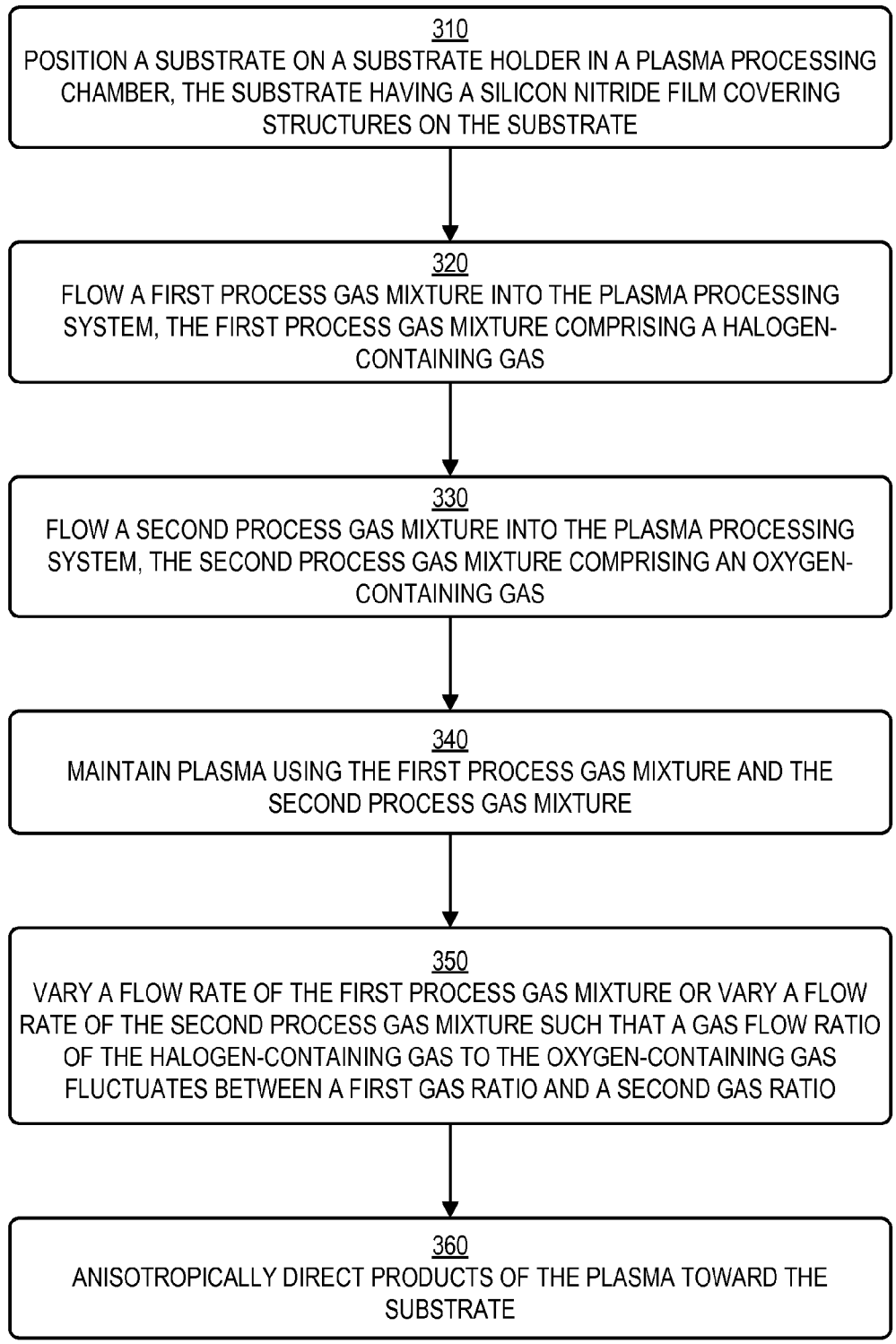
FIG. 3 is a flowchart of an example method as described herein.

Referring now to FIG. 3, embodiments herein can include methods of etching features on a substrate. In step 310, a substrate is positioned on a substrate holder in a plasma processing chamber. For example, a semiconductor wafer can be positioned within a plasma processing chamber. Various types of plasma processing chambers are known and can be used with methods herein. The substrate includes a silicon nitride film or other film covering structures on the substrate. Silicon nitride can conformally cover structures on the substrate including structures of differing heights such as fin and gate structures. Silicon nitride spacer material can be deposited using atomic layer deposition processes, or other deposition techniques.

In step 320, a first process gas mixture is flowed into the plasma processing system. The first process gas mixture comprises a halogen-containing gas. This halogen-containing gas can include a hydrofluorocarbon. In some embodiments, the hydrofluorocarbon gas can be expressed as CxHyFz, wherein X, Y, and Z are non-zero. In other embodiments the hydrofluorocarbon gas can be CH3F. This gas mixture can be flowed into the plasma processing system via various flow schemes such as center and/or edge flow, or a showerhead distribution.

In step 330, a second process gas mixture is flowed into the plasma processing system. The second process gas mixture includes an oxygen-containing gas. For example, the oxygen-containing gas can include O2. Embodiments can also include one or more carrier gases such as argon or helium.

In step 340, a plasma is ignited and maintained using the first process gas mixture and the second process gas mixture as materials from which the plasma is created. The plasma can be maintained, for example, by coupling radiofrequency power to the plasma processing system to energize the process gases.

In step 350, a flow rate of the first process gas mixture or a flow rate of the second process gas mixture is varied such that a gas flow ratio of the halogen-containing gas to the oxygen-containing gas fluctuates between a first gas ratio and a second gas ratio. In other words either of the process gas mixtures can be pulsed and then a flow rate of a process gas mixture varies between a lesser flow rate and a greater flow rate. By way of a specific example, a flow rate of the oxygen-containing gas can be cyclically increased and decreased during the duration of a given etch process. Increasing and decreasing the flow rate of one of the process gas mixtures affects a flow rate ratio of the halogen-containing gas to the oxygen-containing gas. Accordingly, the flow rate can be varied such that a resultant etch selectivity of nitride to silicon is greater than 11:1, and can be even greater than 12:1. In some example embodiments, a given gas flow ratio value can fluctuate between a ratio value of approximately 1.5:1 and 1:1.

In another embodiment, varying the gas flow ratio includes having an etch period in which an sccm (standard cubic centimeters per minute) value of halogen-containing gas flow is greater than an sccm value of oxygen-containing gas flow, which is then followed by an oxidation period in which the sccm value of halogen-containing gas flow is approximately equal to the sccm value of oxygen-containing gas flow. The sccm value of the oxygen-containing gas flow during the oxidation period can have a sufficient increase in flow rate to cause a layer of fluorine-containing silicon oxide to form on exposed silicon surfaces. In another embodiment, the oxidation period is of sufficient duration to form an SiOF layer, on exposed silicon surfaces, having a thickness sufficient to protect silicon surfaces during the etch period, and wherein the oxidation period is less than a particular duration that forms an SiOF layer, on exposed silicon nitride surfaces, having a thickness sufficient to protect nitride surfaces during the etch period. In other words, the oxidation period can be set to the predetermined duration to enable an oxide film to form on silicon surfaces, but without allowing an oxide film to form on silicon nitride surfaces at a thickness that would prevent or stop subsequent etching. SiOF can form at a much greater rate on silicon surfaces as compared to silicon nitride surfaces. The duration of the oxidation period can depend on structure size, critical dimensions, and plasma processing parameters. In some example etch sequences the oxidation period can be a third, a fifth, a tenth, etc., of the duration of each corresponding etch phase.

In step 360, products of the plasma, such as ion species, are anisotropically directed toward the substrate. This can be accomplished by coupling bias power to a lower electrode or substrate holder of the plasma processing system. Such an etch technique can be continued until removing silicon nitride sidewalls of various substrate structures such as fin structures, while leaving silicon nitride on at least a portion of gate sidewall structures of a FinFET device.

Figure 6:
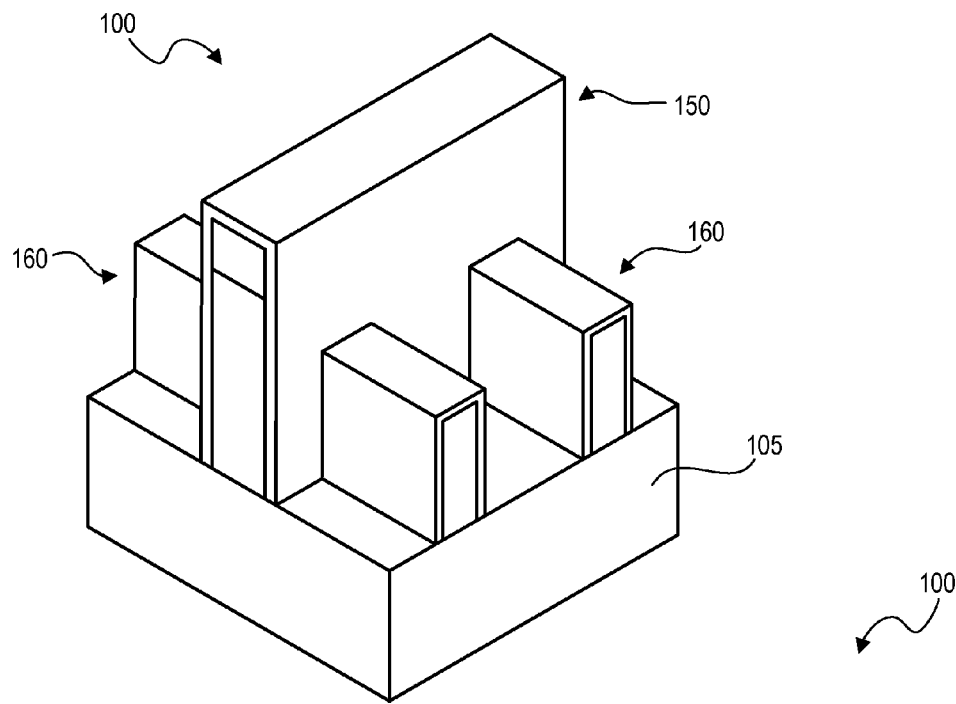
FIG. 6 is a perspective view of a non-planar transistor having a conformal film.

Referring now to FIG. 6, a perspective view of a segment of a conventional FinFET (Fin Field Effect Transistor) device 100 is shown. This particular FinFET device shows a gate 150 and fins 160 on underlying substrate 105. When fabricating a transistor gate, a spacer material is conformally applied to the transistor gate, and then partially removed to form a sidewall spacer on a sidewall of the transistor gate, but while being fully removed from around fins. Typically there will be pull down of the gate spacer material as silicon nitride is vertically etched at a same rate as silicon nitride being etching around fin structures. A sufficient height of gate spacer can remain because of a height differential between gate structures and fin structures, as well as because of one or more cap materials or masks used to extend a height of gates and provide protection to gate structures themselves during fabrication and/or provide a sacrificial segment along which spacer pull down is tolerated. Accordingly, example etch processes aim to clear all vertical spacer material from the fins while leaving a portion of vertical spacer material on the gates.

Figure 7:
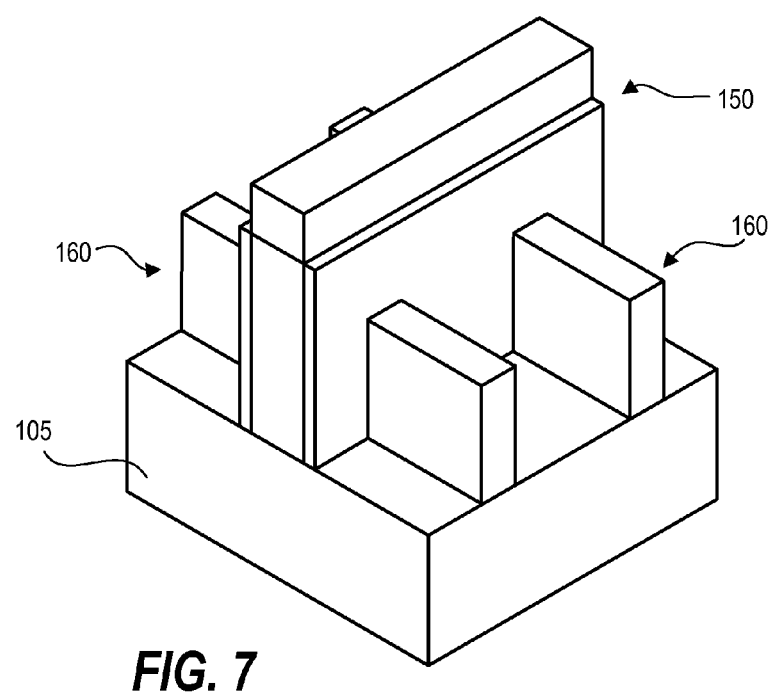
FIG. 7 is a perspective view of a non-planar transistor having a partially-etched conformal film.

As should be evident, an amount of conformal material to remove can depend on relative heights of a given FinFET device. In one non-limiting example, an over etch step may need to remove approximately 25-40 nanometers of vertically oriented conformal film on fins of a given transistor. Removing conformal film from horizontal surfaces including tops of fins as well as surfaces between fins can be relatively quick because the conformal film (relative to an anisotropic etch direction) may only be a few nanometers thick. Accordingly, horizontal surfaces are cleared very quickly and then exposed to etchants for the duration of a main etch and/or over etch process used to clear conformal film material from sidewalls of the fins. FIG. 7 shows an example result depicting the FinFET device 100 after completing a cyclical pulsed etch-oxidation sequence as disclosed herein. Note that the conformal spacer material has been removed from around fins 160 while leaving a conformal sidewall spacer on vertical surfaces of gate 150.

Figure 5:
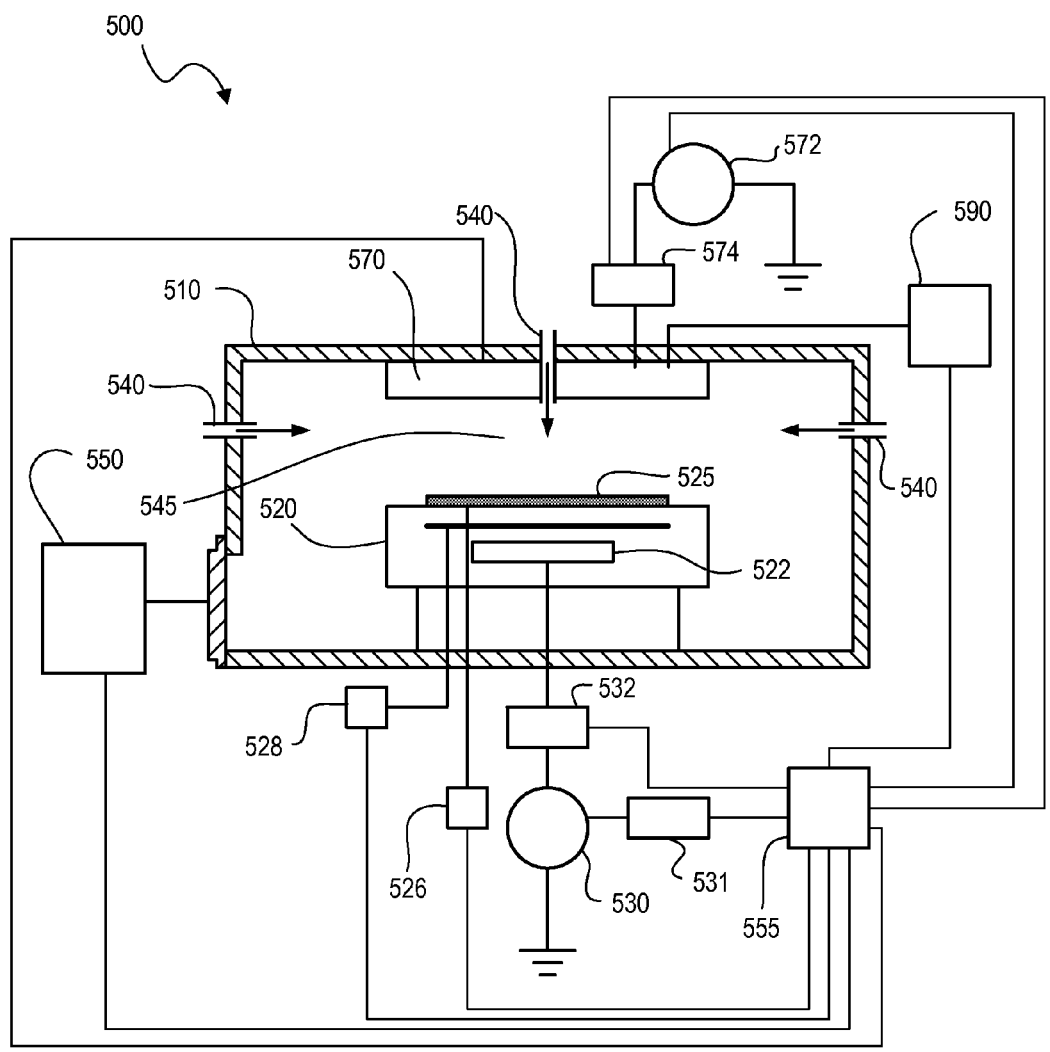
FIG. 5 is a schematic representation of a plasma processing system for implementing methods as disclosed herein.

One or more types of conventional plasma processing systems can be used for executing methods disclosed herein. FIG. 5 shows a schematic representation of an example plasma processing system that can be used with methods disclosed herein. Plasma processing system 500 is configured to perform the above identified process condition, and includes a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, 450 mm or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

Substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example. Alternately, RF power is applied to the substrate holder electrode at multiple frequencies. Furthermore, impedance match network 532 can improve the transfer of RF power to plasma in plasma processing chamber 510 by reducing the reflected power.

Gas distribution system 540 may comprise a center-edge distribution from mixing gases. Alternatively, gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Plasma processing system 500 can further comprise either a stationary, or mechanically or electrically rotating magnetic field system (not shown) to potentially increase plasma density and/or improve plasma processing uniformity. Moreover, controller 555 can be coupled to a magnetic field system to regulate the speed of rotation and field strength. The design and implementation of a rotating magnetic field is well known to those skilled in the art.

Plasma processing system 500 can further comprise an upper electrode 570 to which RF power can be coupled from RF generator 572 through optional impedance match network 574. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 572 and impedance match network 574 in order to control the application of RF power to upper electrode 570.

Plasma processing system 500 can further comprise a direct current (DC) power supply 590 coupled to the upper electrode 570 opposing substrate 525. The upper electrode 570 may comprise an electrode plate. The electrode plate may comprise a silicon-containing electrode plate. Moreover, the electrode plate may comprise a doped silicon electrode plate. The DC power supply 590 can include a variable DC power supply. Additionally, the DC power supply 590 can include a bipolar DC power supply.

Other types of known plasma processing systems can also be used to execute techniques disclosed herein. For example, alternate plasma processing systems (not shown) further comprise an inductive coil to which RF power is coupled via an RF generator through an optional impedance match network. RF power is inductively coupled from the inductive coil through a dielectric window to the plasma processing region. A frequency for the application of RF power to the inductive coil can range from about 10 MHz to about 100 MHz. Similarly, a frequency for the application of power to the chuck electrode can range from about 0.1 MHz to about 100 MHz. In addition, a slotted Faraday shield can be employed to reduce capacitive coupling between the inductive coil and plasma in the plasma processing region. Moreover, a controller can be coupled to the RF generator and the impedance match network to control the application of power to the inductive coil.

In an alternate embodiment, a plasma processing system can comprise an inductive coil that is a "spiral" coil or "pancake" coil in communication with the plasma processing region from above as in a transformer-coupled plasma (TCP) reactor. The design and implementation of an inductively coupled plasma (ICP) source, or transformer-coupled plasma (TCP) source, is well known to those skilled in the art. Alternately, plasma can be formed using electron cyclotron resonance (ECR). In yet another embodiment, the plasma is formed from the launching of a Helicon wave. In yet another embodiment, the plasma is formed from a propagating surface wave. Other plasma processing systems can be similar to the embodiment of FIG. 5, and can further comprise a surface wave plasma (SWP) source. The SWP source can comprise a slot antenna, such as a radial line slot antenna, to which microwave power is coupled via a power coupling system. Each plasma source described above is well known to those skilled in the art.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of etching features on a substrate, the method comprising:
    positioning a substrate on a substrate holder in a plasma processing chamber, the substrate having a silicon nitride film covering structures on the substrate;
    flowing a first process gas mixture into the plasma processing system, the first process gas mixture comprising a halogen-containing gas;
    flowing a second process gas mixture into the plasma processing system, the second process gas mixture comprising an oxygen-containing gas;
    maintain plasma using the first process gas mixture and the second process gas mixture;
    repeatedly varying a flow rate of the first process gas mixture or repeatedly varying a flow rate of the second process gas mixture such that a gas flow ratio of the halogen-containing gas to the oxygen-containing gas fluctuates repeatedly between a first gas ratio and a second gas ratio; and
    anisotropically directing products of the plasma toward the substrate.

2. The method of claim 1, wherein the halogen-containing gas comprises a hydrofluorocarbon.

3. The method of claim 2, wherein the hydrofluorocarbon gas is expressed as $C_xH_yF_z$, wherein x, y, and z are non-zero.

4. The method of claim 3, wherein the hydrofluorocarbon gas is $CH_3F$.

5. The method of claim 1, wherein the oxygen-containing gas comprises O2.

6. The method of claim 1, further comprising flowing a carrier gas into the plasma processing system.

7. The method of claim 6, wherein the carrier gas is argon or helium.

8. The method of claim 1, wherein repeatedly varying the flow rate of the first or second process gas mixture includes repeatedly fluctuating between an etch period in which an sccm (standard cubic centimeters per minute) value of halogen-containing gas flow is greater than an sccm value of oxygen-containing gas flow, and an oxidation period in which the sccm value of halogen-containing gas flow is approximately equal to the sccm value of oxygen-containing gas flow.

9. The method of claim 8, wherein the sccm value of oxygen-containing gas flow during the oxidation period is sufficient to cause a layer of SiOF to form on exposed silicon surfaces.

10. The method of claim 8, wherein the oxidation period is of sufficient duration to form an SiOF layer, on exposed silicon surfaces, having a thickness sufficient to protect silicon surfaces during the etch period, and wherein the oxidation period is less than a particular duration that forms an SiOF layer, on exposed silicon nitride surfaces, having a thickness sufficient to protect nitride surfaces during the etch period.

11. The method of claim 8, wherein the etch period is at least three times greater than the oxidation period.

12. The method of claim 1, wherein the flow rate is varied such that a resultant etch selectivity of nitride to silicon is greater than 11:1.

13. The method of claim 1, wherein varying the gas flow ratio includes having a ratio value that fluctuates between approximately 1.5:1 and 1:1.

14. The method of claim 1, wherein the structures include structures of differing heights relative to each other.

15. The method of claim 14, wherein the structures include gate structures and fin structures of a FinFET structure.

16. The method of claim 15, wherein silicon nitride conformally covers gate structures and fin structures.

17. The method of claim 15, wherein anisotropically directing products of the plasma toward the substrate continues until removing silicon nitride from sidewalls of fin structures, while leaving silicon nitride on at least a portion of gate sidewall structures.

18. A method of etching features on a substrate, the method comprising:
positioning a substrate on a substrate holder in a plasma processing chamber, the substrate having a silicon nitride film conformally covering structures on the substrate, the structures including gate structures and fin structures of a FinFET structure;
flowing a first process gas mixture into the plasma processing system, the first process gas mixture comprising a hydrofluorocarbon gas;
flowing a second process gas mixture into the plasma processing system, the second process gas mixture comprising an oxygen-containing gas;
forming plasma from the first process gas mixture and the second process gas mixture;
repeatedly varying a flow rate of the first process gas mixture or repeatedly varying a flow rate of the second process gas mixture such that a gas flow ratio of the hydrofluorocarbon gas to the oxygen-containing gas repeatedly fluctuates between a first gas ratio defining an etch period and a second gas ratio defining an oxidation period and having a greater proportion of oxygen-containing gas as compared to the etch period such that a protection layer of SiOF forms on exposed silicon surfaces during the oxidation period and etching of silicon nitride occurs during the etch period, wherein the etch period has a duration that is at least three times greater than a duration of the oxidation period; and
anisotropically directing products of the plasma toward the substrate at least until silicon nitride is removed from fin structures.

19. A method of etching features on a substrate, the method comprising:
positioning a substrate in a plasma processing chamber, the substrate having a silicon nitride film conformally covering structures on the substrate, the structures including gate structures and fin structures of a FinFET structure;
establishing a plasma in the plasma processing chamber from a gas mixture of a hydrofluorocarbon gas and an oxygen-containing gas; and
performing a cyclic anisotropic etch using the plasma to achieve a target level of removal of the silicon nitride film from the fin structures and from a portion of the gate structures while leaving the silicon nitride film on at least a portion of the sidewalls of the gate structures to form sidewall spacers, wherein the cyclic anisotropic etch comprises repeatedly cycling between an etching step a) and an oxidation step b) until step a) achieves the target level of removal, wherein the etching step a) and the oxidation step b) comprise, respectively:
a) for a first duration, flowing the hydrofluorocarbon gas and the oxygen-containing gas into the plasma processing system at respective first flow rates to provide a first gas flow ratio of the hydrofluorocarbon gas to the oxygen-containing gas that is greater than 1:1 and that is sufficient to etch the silicon nitride with greater etch selectivity to silicon nitride than to silicon; and
b) for a second duration less than the first duration, flowing the hydrofluorocarbon gas and the oxygen-containing gas into the plasma processing system at respective second flow rates to provide a second gas flow ratio of the hydrofluorocarbon gas to the oxygen-containing gas that is less than the first gas flow ratio to form a protection layer of SiOF on exposed silicon surfaces at a thickness greater than a thickness of SiOF that forms on silicon nitride to protect the exposed silicon surfaces from etching during the next cycle of etching step a).

20. The method of claim 19, wherein the second duration is one-third to one-tenth of the first duration.

21. The method of claim 20, wherein the first gas flow ratio is approximately 1.5:1 and the second gas flow ratio is approximately 1:1.

* * * * *